(12) United States Patent
Uogishi et al.

(10) Patent No.: US 10,897,815 B2
(45) Date of Patent: *Jan. 19, 2021

(54) DISPLAY DEVICE, FLEXIBLE WIRING BOARD, METHOD OF MANUFACTURING THE DISPLAY DEVICE, AND ELECTRONIC DEVICE

(71) Applicant: Japan Display Inc., Minato-ku (JP)

(72) Inventors: Kota Uogishi, Tokyo (JP); Koji Hiramoto, Tokyo (JP); Kengo Kowata, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/935,279

(22) Filed: Jul. 22, 2020

(65) Prior Publication Data

US 2020/0352020 A1 Nov. 5, 2020

Related U.S. Application Data

(63) Continuation of application No. 16/555,561, filed on Aug. 29, 2019, now Pat. No. 10,772,196.

(30) Foreign Application Priority Data

Aug. 29, 2018 (JP) .................................. 2018-160243

(51) Int. Cl.
*H05K 1/00* (2006.01)
*H05K 1/02* (2006.01)
*H05K 1/03* (2006.01)
*H05K 3/28* (2006.01)
*H05K 3/12* (2006.01)

(52) U.S. Cl.
CPC ............ *H05K 1/028* (2013.01); *H05K 1/0306* (2013.01); *H05K 3/1258* (2013.01); *H05K 3/28* (2013.01)

(58) Field of Classification Search
USPC ......................................................... 361/749
See application file for complete search history.

(56) References Cited

U.S. PATENT DOCUMENTS

2011/0298811 A1* 12/2011 Al-Dahle ............... H05K 3/361
345/501
2017/0317127 A1* 11/2017 Hareyama ............... H04N 5/378

* cited by examiner

*Primary Examiner* — Andargie M Aychillhum
(74) *Attorney, Agent, or Firm* — Oblon, McClelland, Maier & Neustadt, L.L.P.

(57) ABSTRACT

According to one embodiment, a display device includes a display panel including pad portions, a flexible printed circuit, the flexible printed circuit includes a base member with a first surface and a second surface, wiring lines, and a protective layer, and including a bend area, and a first edge and a second edge, the base member includes a groove portion located in the bend area and formed in the second surface, a first frame region between the first edge and the groove portion, and a second frame region between the second edge and the groove portion, a thickness of the base member in a position where the groove portion is formed is less than a thickness of the base member in a position which overlaps the first frame region and the second frame region.

18 Claims, 18 Drawing Sheets

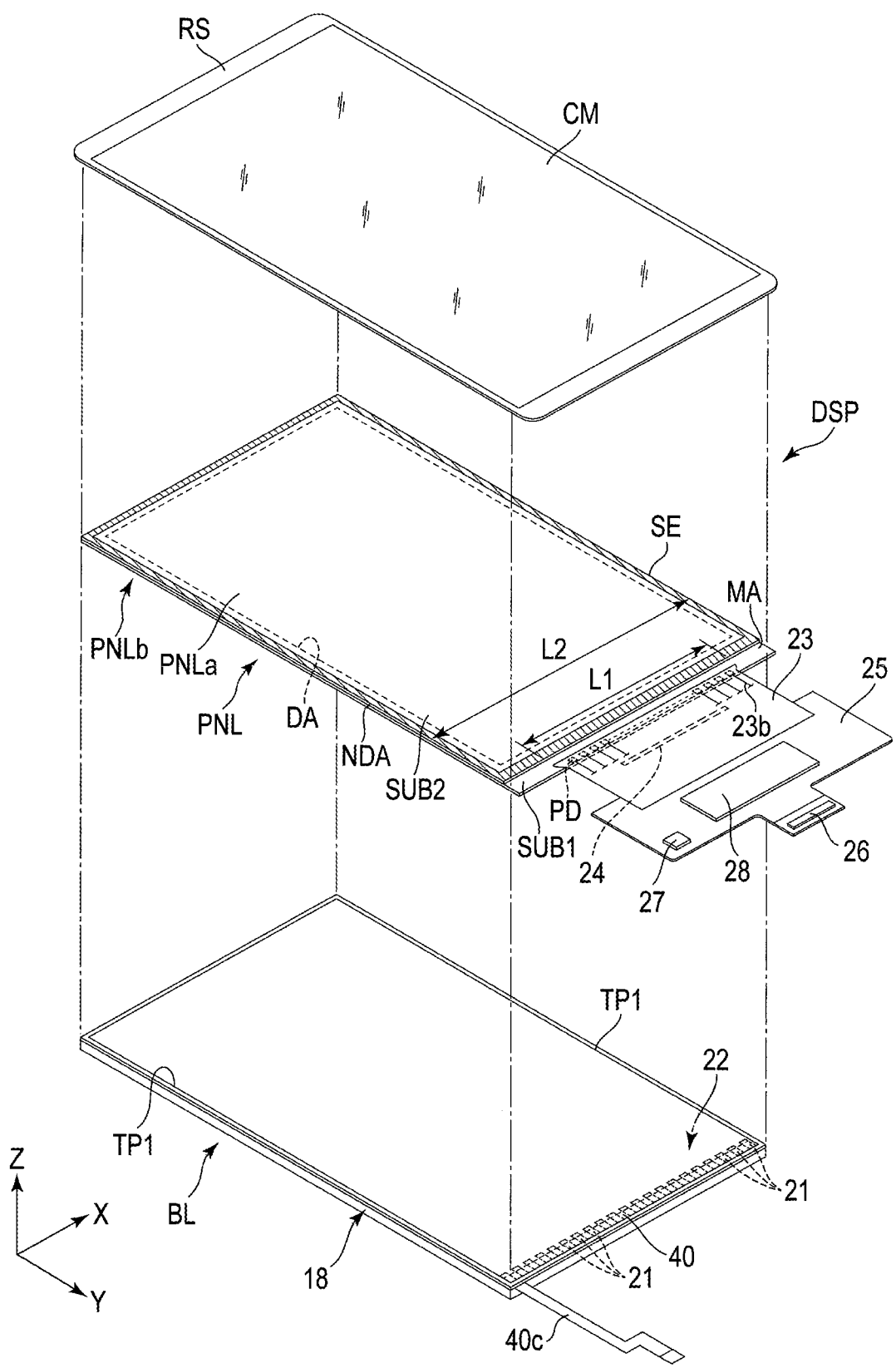
F I G. 1

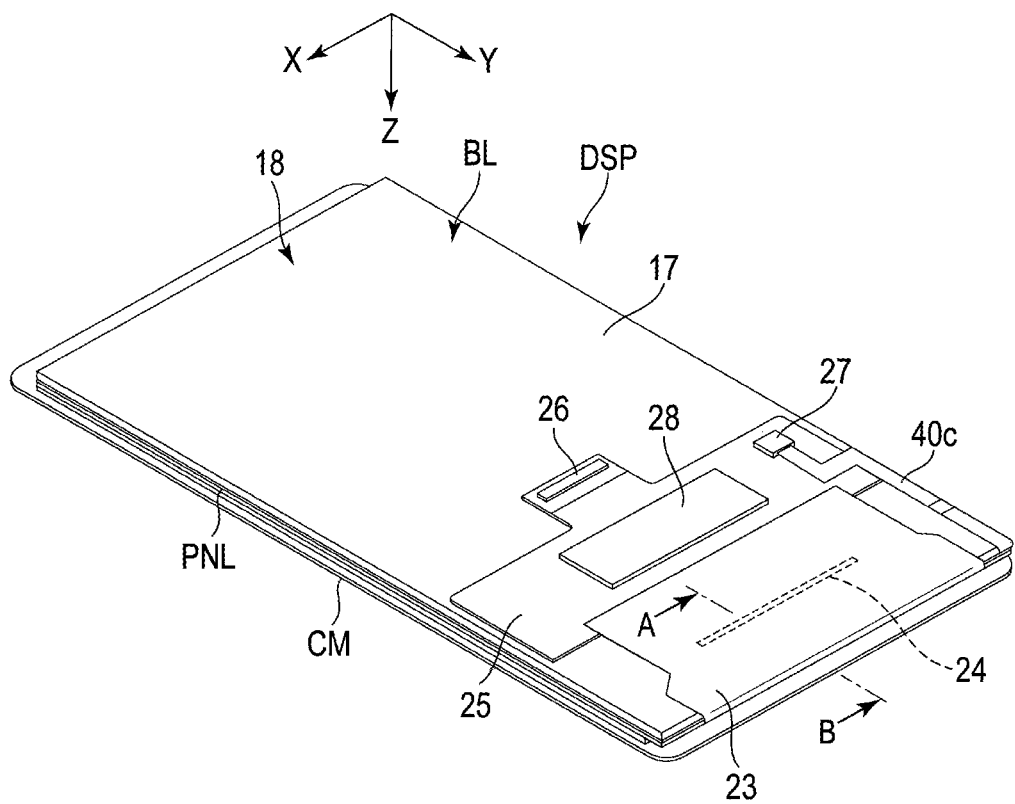
F I G. 2

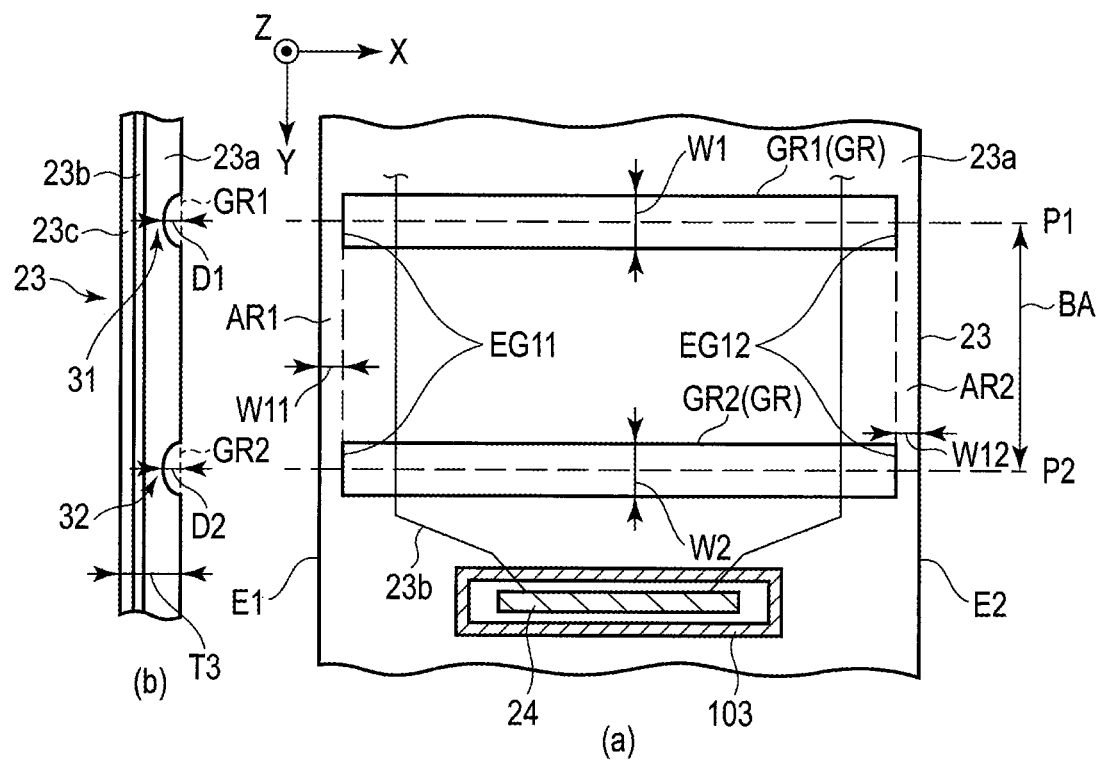
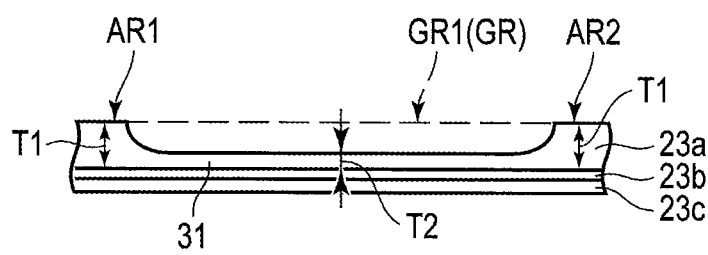
FIG. 4

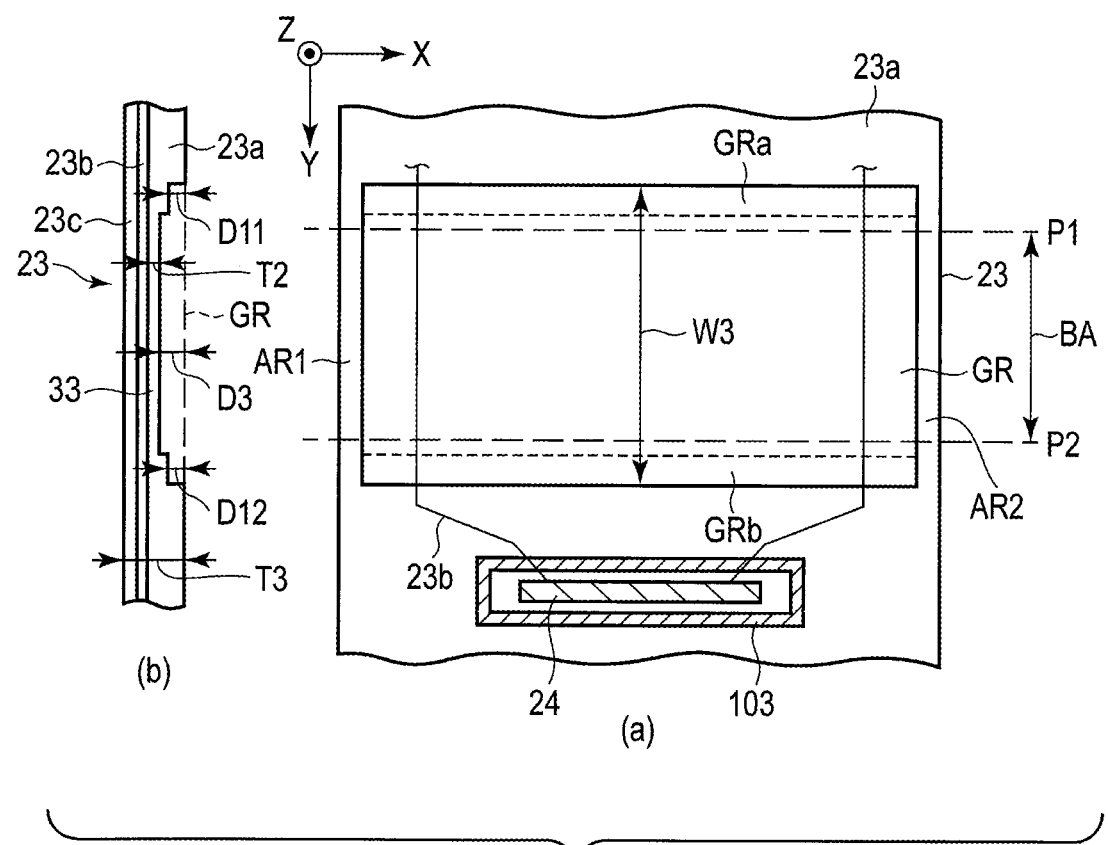
F I G. 10

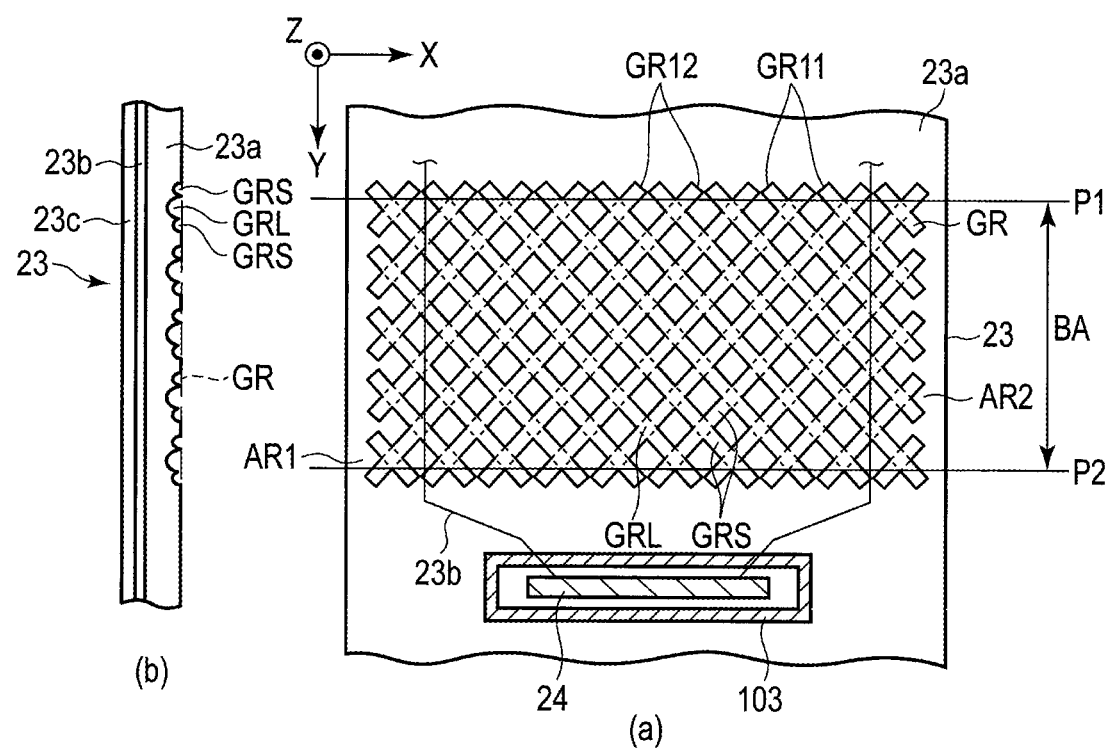
F I G. 14

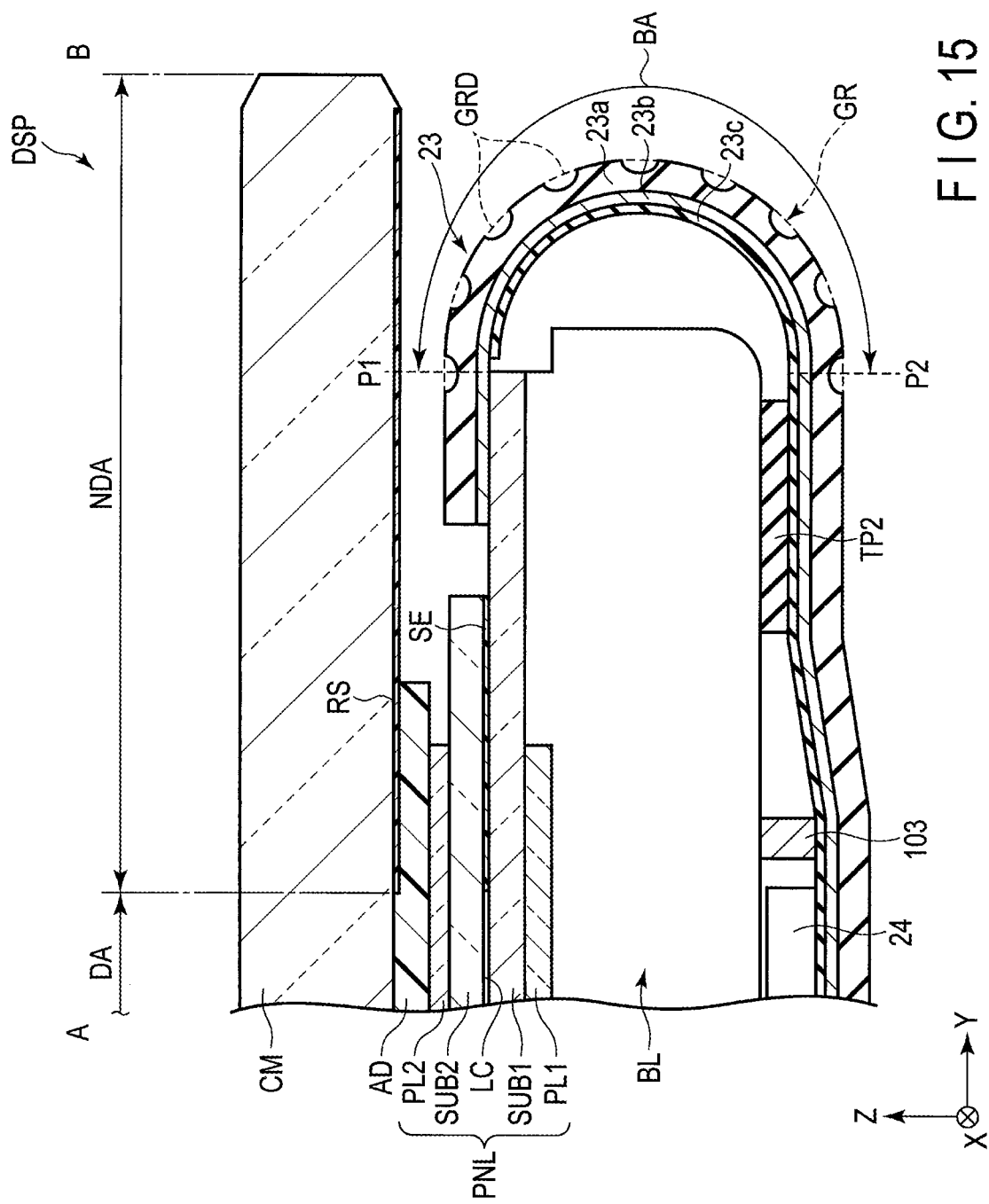
F I G. 15

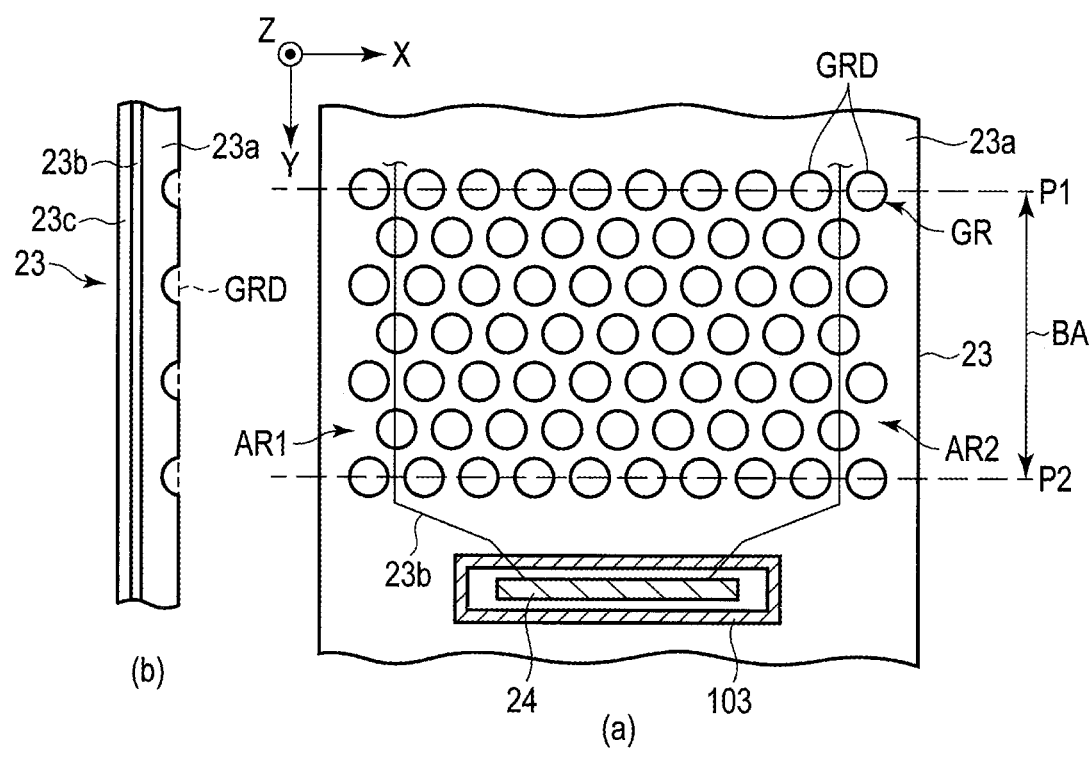
F I G. 16

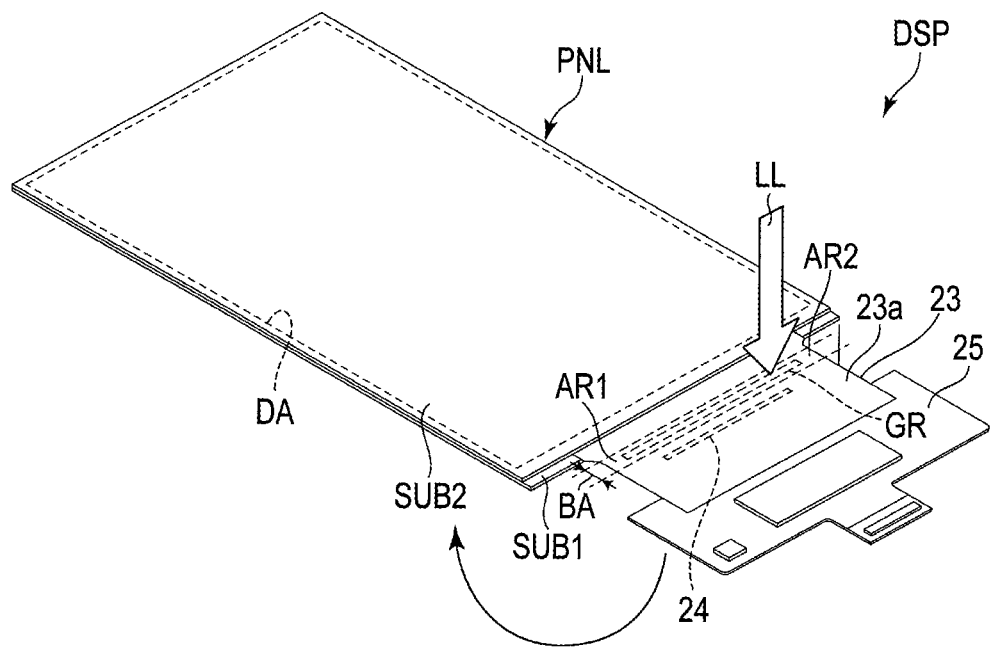
F I G. 19
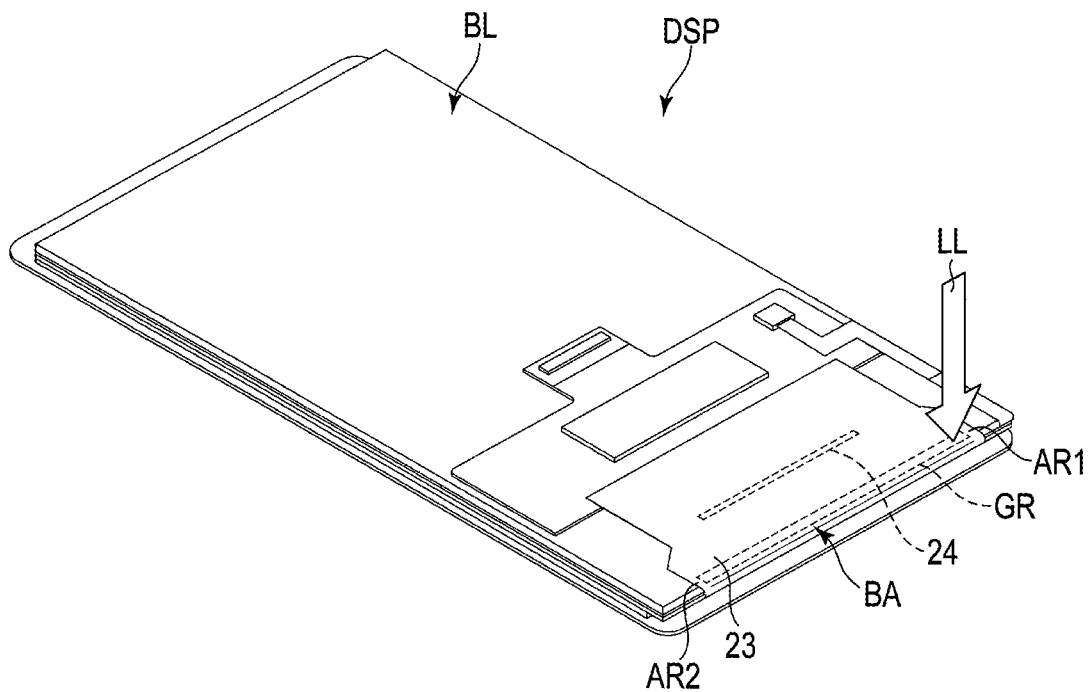
F I G. 20

DISPLAY DEVICE, FLEXIBLE WIRING BOARD, METHOD OF MANUFACTURING THE DISPLAY DEVICE, AND ELECTRONIC DEVICE

CROSS-REFERENCE TO RELATED APPLICATIONS

This application is a continuation of U.S. application Ser. No. 16/555,561 filed Aug. 29, 2019, which is based upon and claims the benefit of priority from Japanese Patent Application No. 2018-160243, filed Aug. 29, 2018, the entire contents of each of which are incorporated herein by reference.

FIELD

Embodiments described herein relate generally to a display device, a flexible wiring board, a method of manufacturing the display device, and an electronic device.

BACKGROUND

Liquid crystal displays, organic EL display devices and the like are widely used as display devices of smart phones, tablet computers, car-navigation systems and the like. Display devices comprise a display panel and a flexible printed circuit (FPC) mounted on the display panel. The FPC is formed to extend outwards from the display panel and then, for example, be folded on a rear surface side of the display panel.

Moreover, the FPC includes a base film, wiring lines on the base film, and a cover film that protects the wiring lines. In order to reduce the repulsive force in bending of an FPC, for example, a technique is known, in which a plurality of grooves are formed in the cover film. However, of the base film, wiring lines and the cover film, the cover film does not create such great influence on the repulsive force of the FPC. Therefore, it is difficult to sufficiently reduce the repulsive force of the FPC by forming grooves in the cover film.

In the meantime, a display device is known, which comprises a tape carrier package (TCP), one end of which is connected to the display panel and the other end is connected to the circuit board. As in the case of the FPC, the TCP comprises a base film, a copper foil on the base film, and a resist layer which covers the copper foil. In order to reduce the peeling force applied to a connected portion between the TCP and the display panel, for example, a plurality of slits which penetrate the base film, are formed in the bent portion of the TCP.

BRIEF DESCRIPTION OF THE DRAWINGS

FIG. 1 is an exploded perspective view showing a display device of the first embodiment.

FIG. 2 is a perspective view showing the display device from a rear surface side.

FIG. 4 is a diagram showing a first wiring substrate shown in FIG. 3.

FIG. 10 is a diagram showing a first wiring substrate shown in FIG. 9.

FIG. 14 is a diagram showing a first wiring substrate shown in FIG. 13.

FIG. 15 is a cross-section a display device, taken along line A-B shown in FIG. 2.

FIG. 16 is a diagram showing a first wiring substrate shown in FIG. 15.

FIG. 19 is a diagram showing a processing step of forming groove portions in the first wiring substrate in the third embodiment.

FIG. 20 is a diagram showing a processing step of forming groove portions in the first wiring substrate in the fourth embodiment.

DETAILED DESCRIPTION

Figure 3:
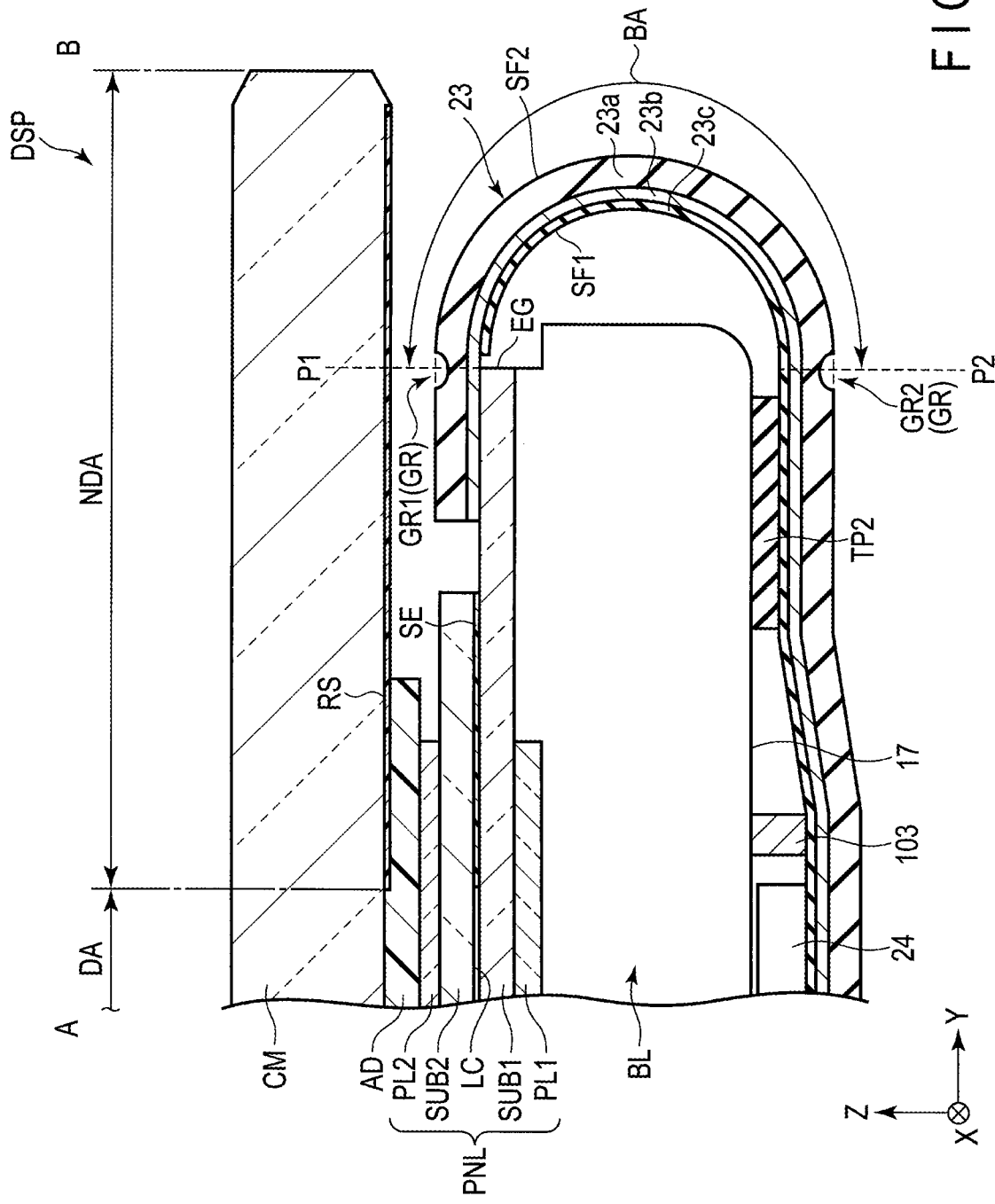
FIG. 3 is a cross-section of the display device taken along line A-B shown in FIG. 2.

In general, according to one embodiment, a display device comprises a display panel comprising a plurality of pad portions arranged along a first direction; and a flexible printed circuit mounted on the display panel and overlapping the plurality of pad portions, the flexible printed circuit comprising a base member with a first surface and a second surface on an opposite side to the first surface, wiring lines located on a side of the first surface of the base member, and a protective layer which covers the wiring lines, and including a bend area to be bent, and a first edge and a second edge extending along a second direction crossing the first direction, the base member comprising a groove portion located in the bend area and formed in the second surface, a first frame region between the first edge and the groove portion, and a second frame region between the second edge and the groove portion, the groove portion being located between the first frame region and the second frame region, and a thickness of the base member in a position where the groove portion is formed is less than a thickness of the base member in a position which overlaps the first frame region and the second frame region.

According to another embodiment, a flexible printed circuit comprises a base member comprising a first surface and a second surface on an opposite side to the first surface, wiring lines located on a side of the first surface of the base member and arranged along a first direction, and a protective layer which covers the wiring lines, the flexible printed circuit including: a bend area to be bent, and a first edge and a second edge, extending along a second direction crossing the first direction, the base member comprising a groove portion located in the bend area and formed in the second surface, a first frame region between the first edge and the groove portion, and a second frame region between the second edge and the groove portion, and the groove portion being located between the first frame region and the second frame region.

According to yet another embodiment, a method of manufacturing a display device comprising a display panel comprising a plurality of pad portions arranged along a first direction and a flexible printed circuit mounted on the display panel and overlapping the plurality of pad portions, the flexible printed circuit comprising a base member with a first surface and a second surface on an opposite side to the first surface, wiring lines located on a side of the first surface of the base member, and a protective layer which covers the wiring lines, and including a bend area to be bent, the method comprising: forming a groove portion in the second surface of the base member by laser after mounting the flexible printed circuit on the display panel.

According to yet another embodiment, an electronic device comprises a glass substrate; a plurality of pad portions arranged along a first direction on the glass substrate; and a flexible printed circuit mounted on the plurality of pad portions, the flexible printed circuit comprising a base member comprising a first surface and a second surface on an opposite side to the first surface, wiring lines located on a side of the first surface of the base member, and a protective layer which covers the wiring lines, the base member comprises a first edge, a second edge and a groove portion formed on the second surface, the groove portion being located between the first edge and the second edge along the first direction, and the both ends of the groove portion along the first direction, being located on inner sides with respect to the first edge and the second edge, respectively, the groove portion not penetrating the base member, one of both ends of the groove portion being located on a side of the first edge and an other end being located on a side of the second edge, and a thickness of the base member between the first edge and the one end and a thickness of the base member between the second edge and the other end being greater than a thickness of the base member in the groove portion.

The embodiments will be described hereinafter with reference to the accompanying drawings. Note that the disclosure is presented for the sake of exemplification, and any modification and variation conceived within the scope and spirit of the invention by a person having ordinary skill in the art are naturally encompassed in the scope of invention of the present application. In addition, in some cases, in order to make the description clearer, the widths, thicknesses, shapes, etc., of the respective parts are schematically illustrated in the drawings as compared to the actual modes. However, the schematic illustration is merely an example, and adds no restrictions to the interpretation of the invention. In addition, in the specification and drawings, the structural elements, which have functions identical or similar to the functions described in connection with preceding drawings, are denoted by like reference numbers, and an overlapping detailed description thereof may be omitted unless otherwise necessary.

The first embodiment will now be described with reference to FIGS. 1 to 4.

FIG. 1 is an exploded perspective view showing a display device DSP of this embodiment.

The main structure of this embodiment can be used for electronic devices such as display devices, which comprise a flexible printed circuit. In the present embodiment, a display device is discussed as an example of the embodiment. For example, the display device can be used in various devices such as smartphones, tablet terminals, mobile phones, notebook personal computers, in-vehicle devices, and game consoles. Note that this embodiment is also applicable for various display devices, for example, liquid crystal display devices, self-luminous display devices such as organic electroluminescent display devices, micro-LED display devices, electronic-paper display devices with an electrophoretic element, display devices adapting micro-electromechanical systems (MEMS), and display devices adapting electrochromism.

In the drawings, a first direction X, a second direction Y, and a third direction Z are orthogonal to each other, but they may cross each other at any angle other than 90 degrees. The first direction X and the second direction Y are equivalent to a direction parallel to the main surface of the substrate which constitutes the display device DSP, and the third direction Z is equivalent to a thickness direction of the display device DSP.

In the following explanations, a direction towards a tip of an arrow indicating the third direction Z is referred to as "up", and a direction opposite from the tip of the arrow is referred to as "down". Moreover, such expressions as "a second member above a first member" and "a second member under a first member" are used to mean that the second member may be in contact with the first member, or may be spaced from the first member. Further, an observation from a tip end side of the arrow which indicates the third direction Z to an X-Y plane defined by the first direction X and the second direction Y is defined as a plan view.

A display device DSP comprises an active-matrix display panel PNL, a cover member CM overlaid on an upper surface PNLa of the display panel PNL so as to cover the entire upper surface PNLa, a backlight unit BL disposed to oppose a lower surface PNLb of the display panel PNL and illuminate the display panel PNL, a first wiring substrate 23 and a second wiring substrate 25.

The display panel PNL includes a rectangular plate-like first substrate SUB1 and a rectangular plate-like second substrate SUB2 disposed to oppose the first substrate SUB1. The first substrate SUB1 and the second substrate SUB2 are bonded to each other with a sealing member SE. The sealing member SE is located in a region shown by hatching in FIG. 1. The first substrate SUB1 and the second substrate SUB2 are each formed of a transparent insulating substrate such as a glass plate or resin plate. Moreover, the first substrate SUB1 includes a mounting portion MA which does not overlap the second substrate SUB2. The first substrate SUB1 comprises a plurality of pad portions PD arranged along the first direction X in the mounting portion MA.

The display panel PNL includes a display area DA which displays images, located in an inner side surrounded by the sealing member SE and a non-display area NDA surrounding the display area DA. The display panel PNL comprises a transmissive display function of displaying images by selectively transmitting light emitted from the backlight unit BL to the display area. Note that the display device DSP need not necessarily comprise a backlight unit BL, but the display panel PNL of this embodiment may be any one of the transmissive type provided with a transmissive display function of displaying images by selectively transmitting light from a lower surface side of the first substrate SUB1, a reflective type provided with a reflective display function of displaying images by selectively reflecting light from an upper surface side of the second substrate SUB2, and a transreflective type provided with both the transmissive display function and the reflective display function.

Here, although an explanation on the detailed structure of the display panel PNL is omitted, but the display panel PNL may have a structure provided for a display mode which uses a lateral electric field along the main surface of the substrate, a display mode which uses a vertical electric field along the normal to the main surface of the substrate, a display mode which uses an inclination electric field inclined along an oblique direction to the main surface of the substrate, or a display mode which uses a lateral electric field, a vertical electric field and an inclined electric field in appropriate combination. Here, the main surface of the substrate is a surface parallel to the X-Y plane defined by the first direction X and the second direction Y.

The display device DSP comprises a flexible first wiring substrate 23 mounted on the mounting portion MA of the display panel PNL. The first wiring substrate 23 overlaps the pad portions PD. A width L1 of one end portion of the first wiring substrate 23 is less than a width L2 of the first substrate SUB1. Moreover, the first wiring substrate 23 includes a plurality of wiring lines 23b arranged along the first direction X, and the wiring lines 23b are connected to the pad portions PD, respectively. A drive IC chip 24 is mounted in the first wiring substrate 23 as a signal supply source which supplies a signal required to drive the display panel PNL. Further, around the drive IC chip 24, a spacer 103, which abuts on the back light unit BL, is provided as will be described later. To an extending end of the first wiring substrate 23, a flexible second wiring substrate 25 is joined. On the second wiring substrate 25, a capacitor 28, connectors 26 and 27 and the like are mounted.

The cover member CM is made from, for example, a glass board or an acrylic transparent resin material of a rectangular plate shape. A frame-like light-shielding layer RS is formed in a peripheral portion of the cover member CM.

The backlight unit BL comprises a case 18, a plurality of optical elements (not shown) disposed in the case 18, a light source unit 22 which supplies light which enters the optical elements, a frame-shaped double-sided tape TP1 and the like. The light source unit 22 comprises a plurality of light sources 21 arranged along the first direction X with predetermined gaps respectively therebetween, and a third wiring substrate 40 extending along the first direction X and supporting the light sources 21. The third wiring substrate 40 comprises a connection end portion 40c integrated thereto as one body.

FIG. 2 is a perspective view showing the display device DSP shown in FIG. 1 from a rear surface side.

The first wiring substrate 23 is folded back onto the rear surface side of the display panel PNL. In the example illustrated, the folded portion of the first wiring substrate 23 opposes a bottom surface 17 of the backlight unit BL. Further, the connection end portion 40c is folded back on the rear surface side of the display panel PNL as in the case of the first wiring substrate 23, to oppose the bottom surface 17 of the backlight unit BL. The connection end portion 40c is connected to the connector 27.

FIG. 3 is a cross section of the display device DSP, taken along line A-B shown in FIG. 2.

The display panel PNL includes the first substrate SUB1, the second substrate SUB2 and a liquid crystal layer LC in an inner side surrounded by the sealing member SE. Further, the display panel PNL comprises a first polarizer PL1 and a second polarizer PL2. The first polarizer PL1 is adhered on the lower surface of the first substrate SUB1. The second polarizer PL2 is adhered on the upper surface of the second substrate 20.

The cover member CM is adhered to the display panel PNL with an adhesive AD. The light-shielding layer RS is located on the lower surface of the cover member CM to be in contact with the adhesive AD. The light-shielding layer RS is located on the non-display area NDA. Note that the light-shielding layer RS may be formed on the upper surface of the cover member CM.

The first wiring substrate 23 is electrically connected and adhered to the display panel PNL by an anisotropy conductive film, which is a conductive material. In other words, the anisotropic conducting film (not shown) is interposed between the first substrate SUB1 and the mounting portion of the first wiring substrate 23. While interposing the anisotropic conducting film between the first wiring substrate 23 and the display panel PNL, the first wiring substrate 23 and the display panel PNL are pressurized in the third direction Z from upper and lower directions and heated, thereby connecting these members electrically and physically together.

The first wiring substrate 23 comprises a base member 23a, wiring lines 23b, and a protective layer 23c which covers the wiring lines 23b. The base member 23a comprises a first surface SF1 and a second surface SF2 on an opposite side to the first surface SF1. The wiring lines 23b are located on a first surface SF1 side of the base member 23a. The base member 23a and the protective layer 23c are formed from, for example, a synthetic resin such as polyimide or polyurethane. The wiring lines 23b are formed from, for example, a copper foil. The drive IC chip 24 is mounted on a protective layer 23c side and is electrically connected to the wiring lines 23b via openings or contact pads (not shown) provided in the protective layer 23c. Further, the first wiring substrate 23 is fixed to the bottom surface 17 of the backlight unit BL with a double-sided tape TP2. Furthermore, the first wiring substrate 23 is provided with the spacer 103, and thus has such a structure that the drive IC chip 24 is not brought into direct contact with the backlight unit BL. As shown in FIG. 4, part (a), the spacer 103 surrounds the drive IC chip 24.

The first wiring substrate 23 includes a bend area BA, which is bent. The first wiring substrate 23 is bent so that the protective layer 23c oppose the display panel PNL and the back light unit BL. More specifically, the protective layer 23c is located on an inner circumferential side of the bend area BA, and the base member 23a is located on an outer circumferential side of the bend area BA. The first wiring substrate 23 comprises, in the bend area BA, a bending start point P1 on a display panel PNL side, and a being end point P2 on a side spaced from the display panel PNL with respect to the bending start point P1. The bend area BA is equivalent to the region between the bending start point P1 and the end point P2. That is, the first wiring substrate 23 has a curvature between the bending start point P1 and the ending points P2.

The base member 23a comprises groove portions GR located in the bend area BA and opened in a second surface SF2. In the example illustrated, the groove portions GR includes a first groove portion GR1 and a second groove portion GR2. The first groove portion GR1 is located at the bending start point P1. The second groove portion GR2 is located at the bending end point P2. The first groove portion GR1 is located immediately above an end portion EG of the first substrate SUB1. Note that, as shown in the figure, the groove portions GR may be formed even to an outer side of the bend area BA. At least a part of the groove portions GR overlaps the display panel PNL (glass substrate) along the third direction. Moreover, the groove portions GR do not penetrate the base member 23a.

FIG. 4 is a diagram showing the first wiring substrate 23 shown in FIG. 3. FIG. 4, in part (a), is a plan view of the first wiring substrate 23 when it developed, FIG. 4, in part (b), is a cross section of the first wiring substrate 23 when developed along the second direction Y of, and FIG. 4, part (c) is a cross section of the first wiring substrate 23 when developed along the first direction X.

The bending start point P1 and the bending end point P2 extend along the first direction X. The first groove portion GR1 overlaps the bending start point P1 and extends along the first direction X. The second groove portion GR2 overlaps the bending end point P2 and extends along the first direction X. The groove portions GR of this embodiment overlap the wiring lines 23b and cross the wiring lines 23b. The first wiring substrate 23 comprises a first edge E1 and a second edge E2, extending along the second direction Y. In the example illustrated, the first edge E1 and the second edge E2 extend substantially parallel to each other, but one or both of the edges may be inclined with respect to the second direction Y. The base member 23a includes a first frame region AR1 along the first edge E1, and a second frame region AR2 along the second edge E2. The groove portions GR are located between the first frame region AR1 and the second frame region AR2. That is, the groove portions GR do not overlap the first frame region AR1 or the second frame region AR2, but do not extend to the first edge E1 and the second edge E2. Moreover, in the first direction X, the groove portions GR are located between the first edge E1 and the second edge E2. The groove portions GR each include end portions EG11 and EG12 along the first direction X. The end portions EG11 and EG12 of the groove portion GR are located on an inner side with respect to the first edge E1 and the second edge E2. Of the both ends of the groove portion GR, one end portion EG11 is located on a first edge E1 side and another end portion EG12 is located on a second edge E2 side. The first frame region AR1 has a width W11 and the second frame region AR2 has a width W12. The widths W11 and W12 are, for example, substantially equal to each other, and are each 0.2 mm or greater but 0.5 mm or less. Note that the width W1 and the width W2 may be different from each other.

The base member 23a has a thickness T1 in each of the first frame region AR1 and the second frame region AR2 and has a thickness T2 in the groove portions GR. That is, the base member 23a has the thickness T1 between the first edge E1 and the end portion EG11 and between the second edge E2 and the end portion EG12. The thickness T1 is greater than the thickness T2. The thickness T2 is 0.25 to 0.7 times the thickness T1. The thickness T1 is, for example, about 35 μm. Moreover, the wiring substrate 23 has a thickness T3, and the thickness T3 is, for example, about 52 μm. The first groove portion GR1 has the width W1 and the second groove portion GR2 has the width W2, and the width W1 and W2 are each, for example, about 25 to 100 μm. The width W1 and the width W2 may be different from each other. Moreover, the first groove portion GR1 has a depth D1 and the second groove portion GR2 has a depth D2, and the depth D1 are D2 are each, for example, about 10 to 25 μm. The depths D1 and D2 may be different from each other.

In the base member 23a, the thickness of the region where the first groove portion GR1 and the second groove portion GR2 are formed is reduced. That is, the base member 23a includes thin portions 31 and 32, which are reduced in thickness by the depth D1 of the first groove portion GR1 and the depth D2 of the second groove portion GR2, respectively. The thickness of the thin portion 31 is (T3−D1) and that of the thin portion 32 is (T3−D2) are each about 10 to 25 μm. The thickness of each of the thin portions 31 and 32 is set to that at which the thin portions 31 and 32 do not break even if bent, in consideration of the intensity of the base member 23a.

Here, the effect of this embodiment will be described.

In the example shown in FIG. 3, the drive IC chip 24 is mounted on the wiring substrate 23. With this structure, as compared to the case where the drive IC chip 24 is not mounted, the thickness of the wiring substrate 23 needs to be increased to improve the strength of the substrate, in which case, the repulsive force against bending may increase. Further, in order to reduce the width of the frame of the display device DSP, there is a tendency of increasing the curvature of the bend area BA, and therefore steeper bending is required. Thus, the repulsive force against the bending of the wiring substrate 23 may undesirably increase further more. On the other hand, with the narrowed frame, the adhesion area between the display panel PNL and the backlight unit BL is lessened, and therefore the adhesion between the display panel PNL and the backlight unit BL is weakened. That is, as the repulsive force of the wiring substrate 23 is increased by the narrowed frame, the adhesion may be decreased in a tradeoff manner, which may cause detaching of the junction between the backlight unit BL and the display panel PNL, and detaching, deformation and the like of the internal parts of the backlight unit BL.

According to this embodiment, the wiring substrate 23 comprises the groove portions GR formed in the base member 23a. With this structure, the thin portions can be formed in the wiring substrate 23, and the rigidity of the wiring substrate 23 can be reduced. Further, the wiring substrate 23 can be easily bent, and the repulsive force of the wiring substrate 23, caused by bending, can be reduced. In this manner, detaching of the junction between the backlight unit BL and the display panel PNL, detaching of the double-sided tape TP2, the detaching, deformation, etc., of the internal parts of the backlight unit BL, which result from the repulsive force of the wiring substrate 23, can be suppressed. Moreover, in the case of a display device DSP where a backlight unit BL is not necessary, the detaching of the wiring substrate 23, and the detaching, deformation, etc., of members to which the wiring substrate 23 is joined, can be suppressed. Further, the number of parts conventionally required to attach the wiring substrate 23 against the repulsive force can be reduced, which leads to reduction of the manufacturing cost and the number of assembling steps.

Moreover, with the reduction of the repulsive force against the bending of the wiring substrate 23, the wiring substrate 23 can be bent more steeply and outward swelling of the wiring substrate 23 can be reduced. Thereby, the frame of the display device DSP can be narrowed.

In the example illustrated, moreover, the first groove portion GR1 and the second groove portion GR2 are located in the positions where the bending start point P1 and the bending end point P2 overlap each other. In the bending start point P1 and the bending end point P2, a particularly large shearing stress is easily created under the influence of bending stress. However, the thicknesses at the bending start point P1 and the bending end point P2 of the wiring substrate 23 are reduced by the first groove portion GR1 and the second groove portion GR, the shearing stress can be eased. With this structure, even in the parts where stress is particularly great, the fracture of the wiring substrate 23 and breaking of the wiring lines 23b can be suppressed.

Moreover, in this embodiment, the base member 23a includes a first frame region AR1 and a second frame region AR2, and the groove portions GR do not overlap the first frame region AR1 and the second frame region AR2. That is, the groove portions GR do not extend to the first edge E1 and the second edge E2 of the wiring substrate 23. With this structure, there is no thinned part created in the first edge E1 and the second edge E2, thereby making it possible to inhibit the wiring substrate 23 fracturing from the first edge E1 and the second edge E2.

Next, the first modified example of the first embodiment will be described with reference to FIGS. 5 and 6.

Figure 5:
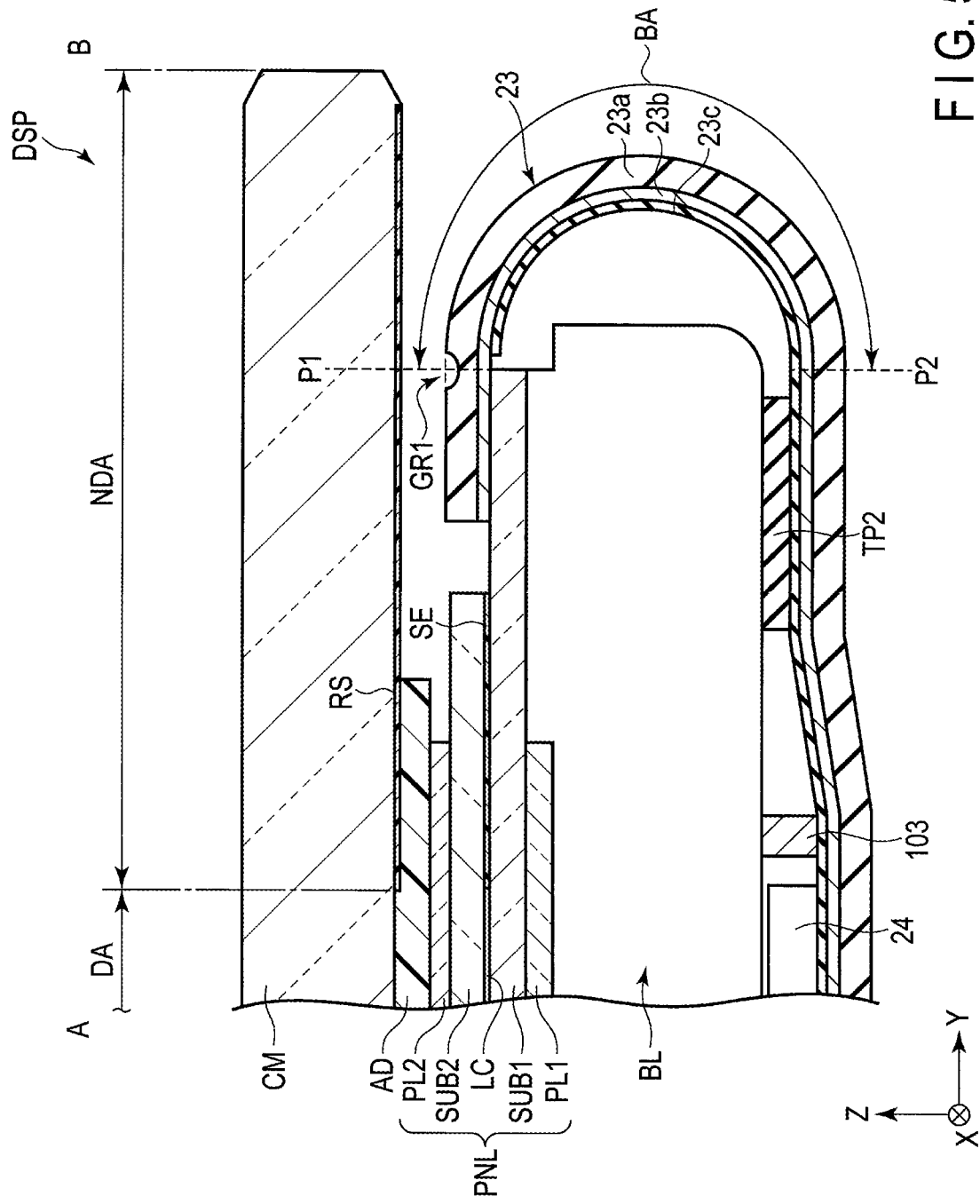
FIG. 5 is a cross-section of a first modified example of the first embodiment.

FIG. 5 is a cross-section of the first modified example of the first embodiment shown in FIG. 3. FIG. 6 is a diagram showing the wiring substrate 23 shown in FIG. 5. FIG. 6, part (a), shows a plan view of the wiring substrate 23 when developed, and FIG. 6, part (b), shows a cross section of the wiring substrate 23 along the second direction Y when developed. The structure shown in FIGS. 5 and 6 are different from that of FIGS. 3 and 4 in that the base member 23a comprises a first groove portion GR1 and does not comprise a second groove portion GR2.

Figure 6:
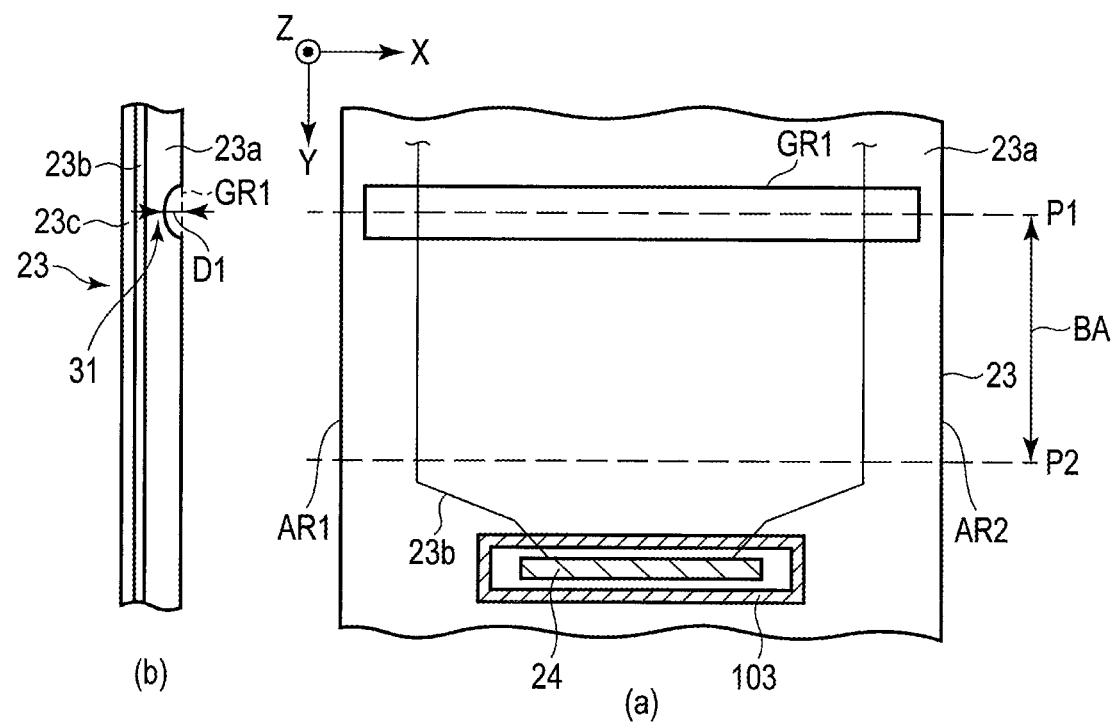
FIG. 6 is a diagram showing the first wiring substrate shown in FIG. 5.

The structure of the first groove portion GR1 shown in FIGS. 5 and 6 is equal to the structure of first groove portion GR1 shown in FIGS. 3 and 4. The bending start point P1 is a position in the bend area BA, where the repulsive force is at the largest, and therefore the repulsive force of the wiring substrate 23 can be efficiently relaxed by setting the location of the first groove portion GR1 at the bending start point P1.

In the first modified example as well, an effect similar to that of the first embodiment described can be obtained.

Next, the second modified example of the first embodiment will be described with reference to FIGS. 7 and 8.

Figure 7:
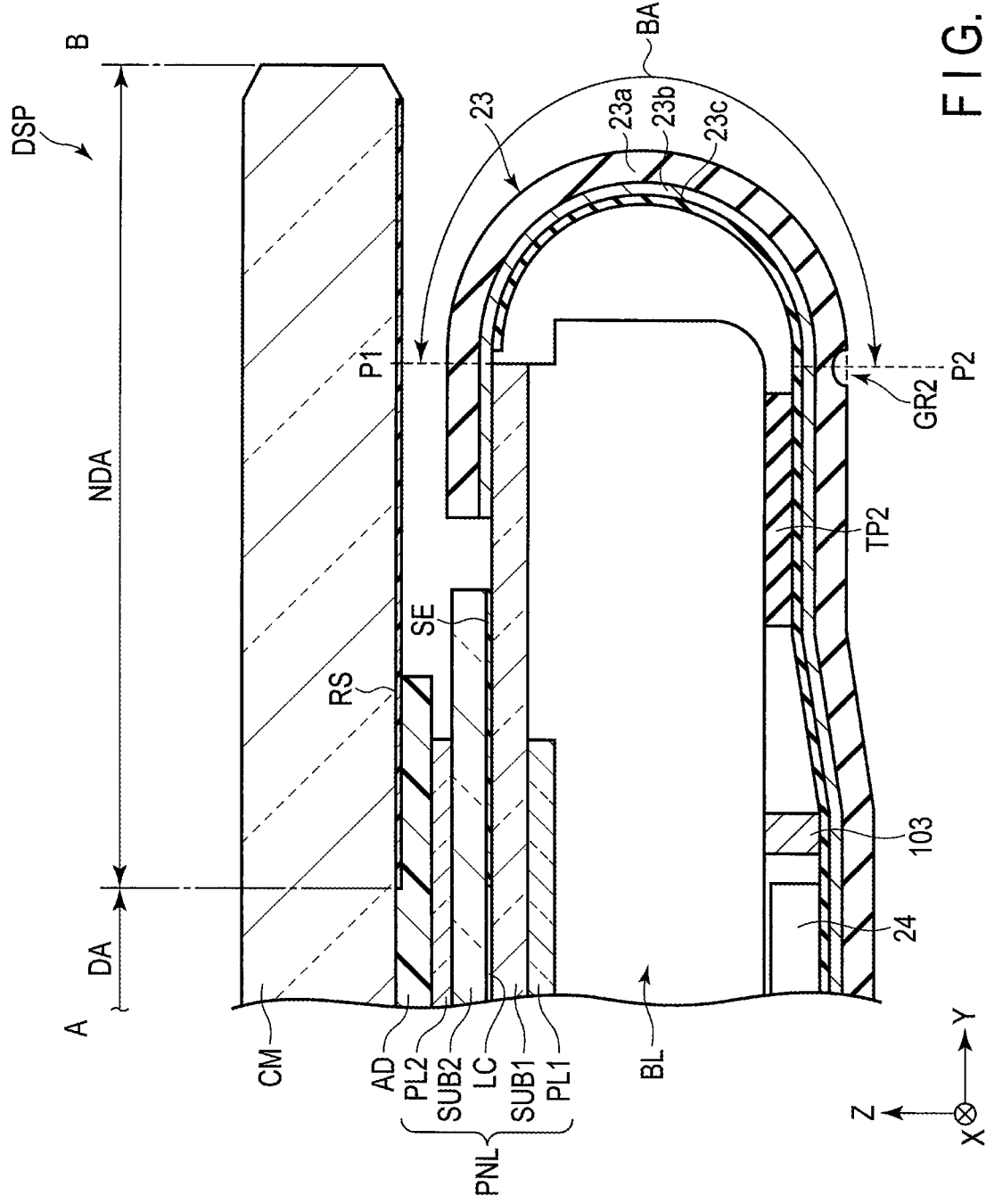
FIG. 7 is a cross section of a second modified example of the first embodiment shown in FIG. 3.

FIG. 7 is a cross-section showing the second modified example of the first embodiment shown in FIG. 3. FIG. 8 is a diagram showing the wiring substrate 23 shown in FIG. 7. FIG. 8, part (a) shows a plan view of the wiring substrate 23 when developed, and FIG. 8, part (b) shows a cross section of the wiring substrate 23 along the second direction Y when developed. The structure shown in FIGS. 7 and 8 is different from the structure shown in FIGS. 3 and 4 in that the base member 23a comprises a second groove portion GR2 and does not comprise a first groove portion GR1.

Figure 8:
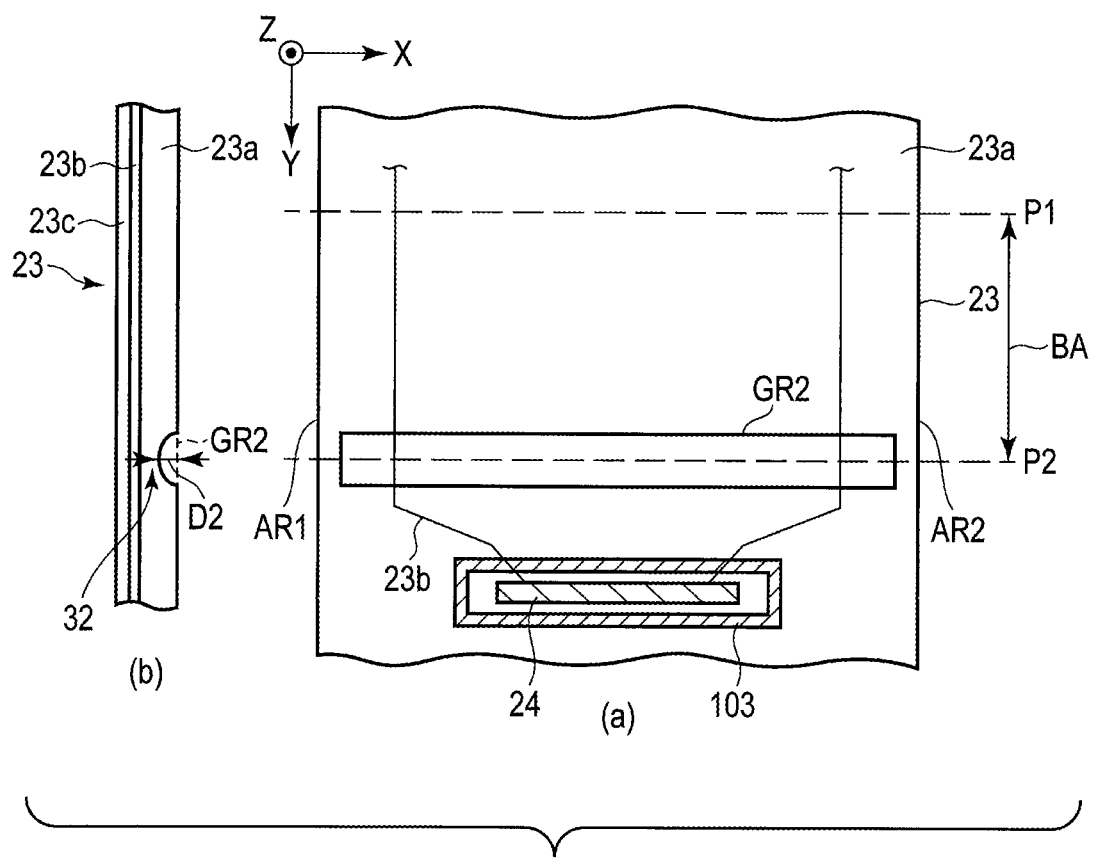
FIG. 8 is a diagram showing the first wiring substrate shown in FIG. 7.

The structure of the second groove portion GR2 shown in FIGS. 7 and 8 is the same as the structure of the second groove portion GR2 shown in FIGS. 3 and 4. The bending end point P2 is located at the position most close to the double-sided tape TP2 in the bend area BA. Thus, with the second groove portion GR2 located at the bending end point P2, the detaching force produced in the adhered portion between the backlight unit BL and the wiring substrate 23 can be reduced efficiently.

According to the second modified example described above, an effect similar to that of the first embodiment can be obtained.

Next, the second embodiment will now be described with reference to FIGS. 9 and 10.

Figure 9:
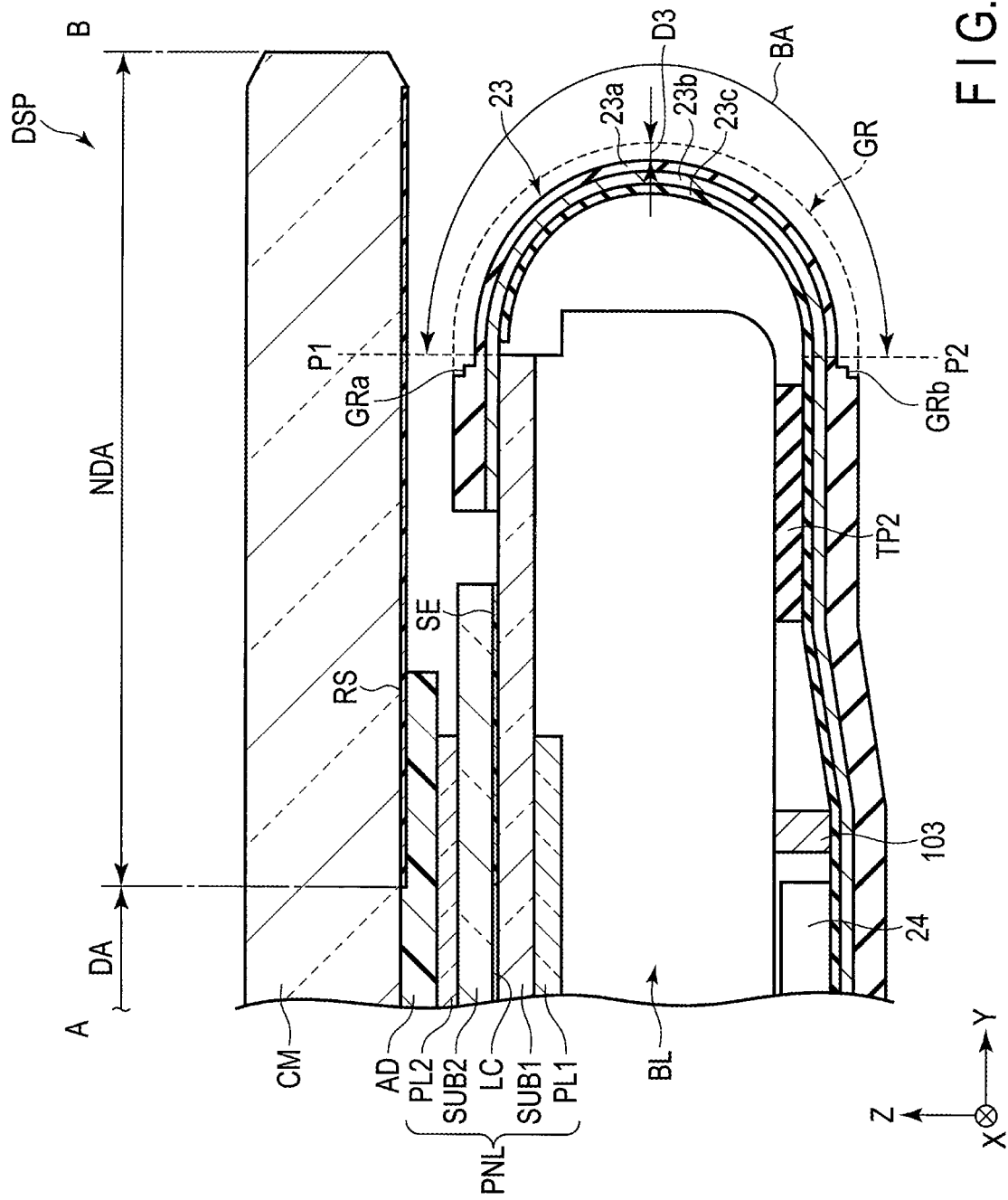
FIG. 9 is a cross-section of a display device of the second embodiment, taken along line A-B shown in FIG. 2.

FIG. 9 is a cross-section of a display device DSP taken along line A-B shown in FIG. 2. FIG. 10 is a diagram showing the wiring substrate 231 shown in FIG. 9. FIG. 10, part (a) shows a plan view showing the wiring substrate 23 when developed, and FIG. 10, part (b) shows a cross section of the wiring substrate 23 along the second direction Y when developed. The structure shown in FIGS. 9 and 10 is different from the structure in FIGS. 3 and 4 in the shape of the groove portions GR.

The groove portions GR comprise stepped portions GRa and GRb, respectively. The stepped portions GRa and GRb extend along the first direction X. Moreover, the groove portions GR are located in an entire region surrounded by the first frame region AR1, the second frame region AR2, the bending start point P1 and the bending end point P2. Note that the groove portions GR extend to an outer side with respect to the bending start point P1 and the bending end point P2. In the example illustrated, the stepped portions GRa and GRb are located on outer sides of the bend area BA.

The base member 23a has a thickness T2 in the groove portions GR. A width W3 of the groove portions GR is greater than the widths W1 and W2 of the first groove portion GR1 and the second groove portion GR2, respectively. The groove portions GR are formed to have a depth D3, which is substantially even over the bend area BA, and, for example, 10 to 25 µm. Moreover, the groove portions GR have depths D11 and D12 in the stepped portions GRa and GRb, respectively. The depths D11 and D12 are each less than the depth D3. In the region of the base member 23a, where the groove portions GR are formed, the thickness is reduced. That is, the base member 23a comprises a thin portion 33, where the thickness is reduced by the depths D3, D11 and D12 of the groove portions GR. The thickness of the thin portion 33 is, for example, about 10 to 25 µm.

According to the second embodiment, the entire region of the bend area BA is formed into the thin portion 33, the rigidity of the entire bend area BA can be decreased, to make it easily bendable. Further, the repulsive force of the wiring substrate 23, created by bending, can be further reduced. Moreover, as shown in FIG. 9, the wiring substrate 23 is thinned by the depth D3 of the groove portions GR, and therefore the outward swelling of the bend area BA ca be reduced.

In the second embodiment, an advantageous effect similar to that of the first embodiment can be obtained.

A modified example of the second embodiment will now be described with reference to FIGS. 11 and 12.

Figure 11:
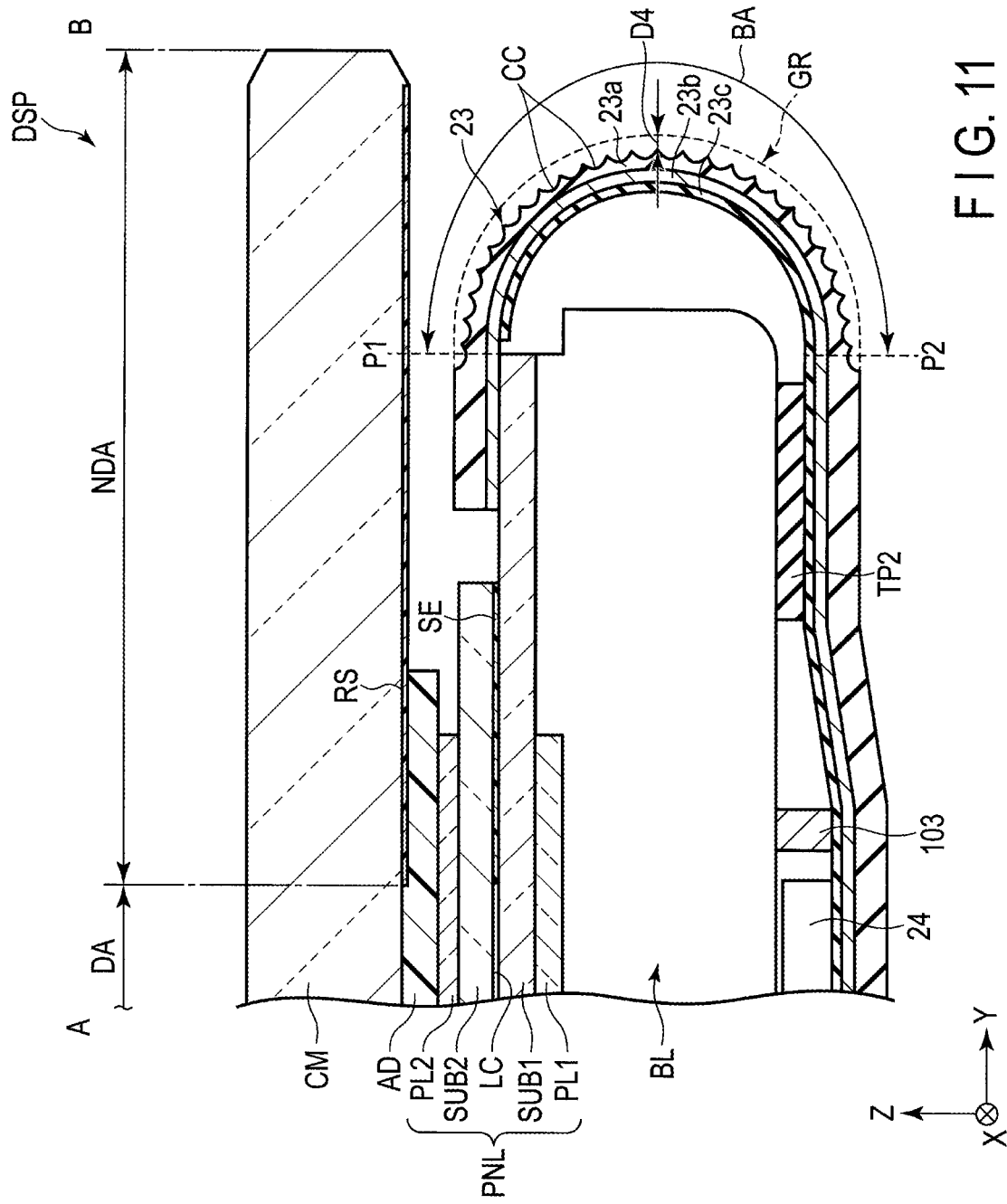
FIG. 11 is a cross-section showing a modified example of the second embodiment.
Figure 12:
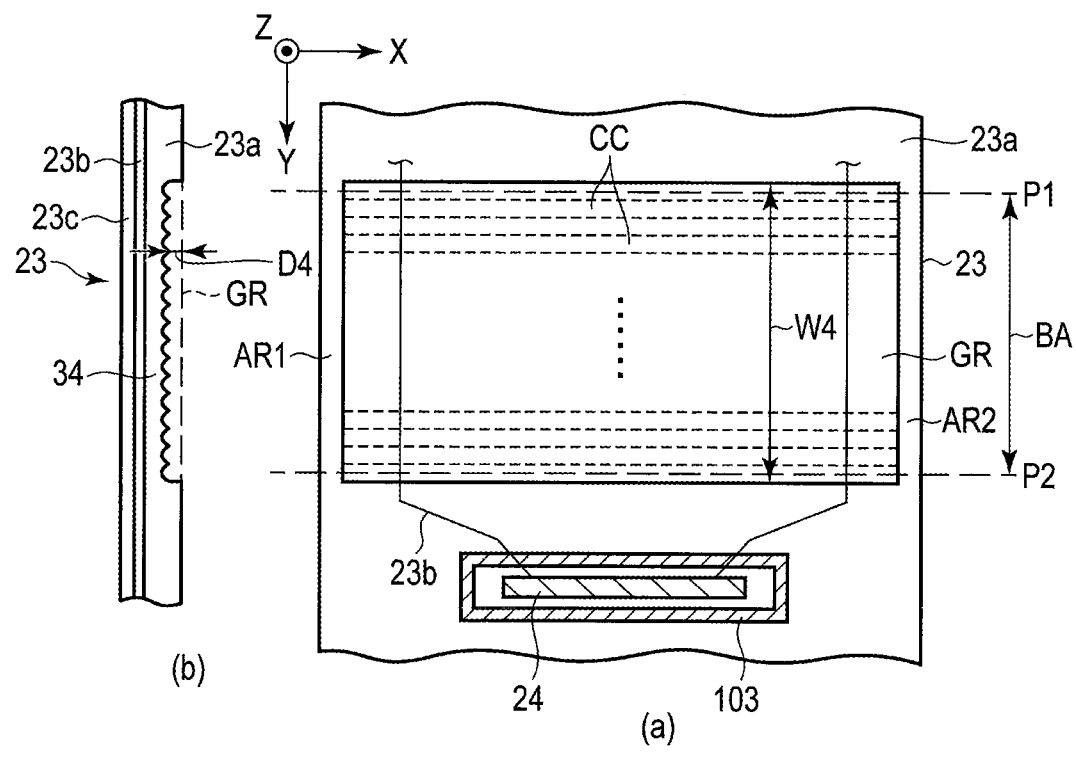
FIG. 12 is a diagram showing a first wiring substrate shown in FIG. 11.

FIG. 11 is a cross-section showing a modified example of the second embodiment shown in FIG. 9. FIG. 12 is a diagram showing the wiring substrate 23 shown in FIG. 11. FIG. 12, part (a) shows a plan view of the wiring substrate 23 when developed, and FIG. 12, part (b) shows a cross section of the wiring substrate 23 along the second direction Y when developed. The structure shown in FIGS. 11 and 12 is different from the structure shown in FIGS. 9 and 10 in the shape of the groove portions GR.

The groove portion GR comprises has a plurality of concavities CC. The concavities CC each extend along the first direction X. These concavities CC are formed by, for example, linear processing with UV laser. Moreover, the groove portion GR is located in the entire region surrounded by the first frame region AR1, the second frame region AR2, the bending start point P1 and the bending end point P2. Note that the groove portion GR extends out to outer sides of the bending start point P1 and the bending end point P2, respectively.

A width W4 of the groove portion GR is greater than the widths W1 and W2 of the first groove portion GR1 and the second groove portion GR2, respectively. Moreover, the width W4 is substantially equal to the width W3 described above. The depth D4 of the groove portion GR varies from one location to another, but is, for example, 10 to 25 µm. In the base member 23a, the region where the groove portion GR is formed is formed thin. That is, the base member 23a includes a thin portion 34 where the thickness is reduced by the depth D4 of the groove portion GR. The thickness of the thin portion 34 is, for example, about 10 to 25 µm.

According to the second embodiment, the entire region of the bend area BA is formed into the thin portion 34, and thus the rigidity of the bend area BA is reduced, thus making it easily bendable. Further, the repulsive force of the wiring substrate 23, caused by bending, can be further reduced. Moreover, as shown in FIG. 11, the wiring substrate 23 is thinned by the depth D4 of the groove portion GR, and therefore the outward swelling of the bend area BA can be reduced.

In such a modified example of the second embodiment as well, an advantageous effect similar to that of the first embodiment can be obtained.

Next, the third embodiment will now be described with reference to FIGS. 13 and 14.

Figure 13:
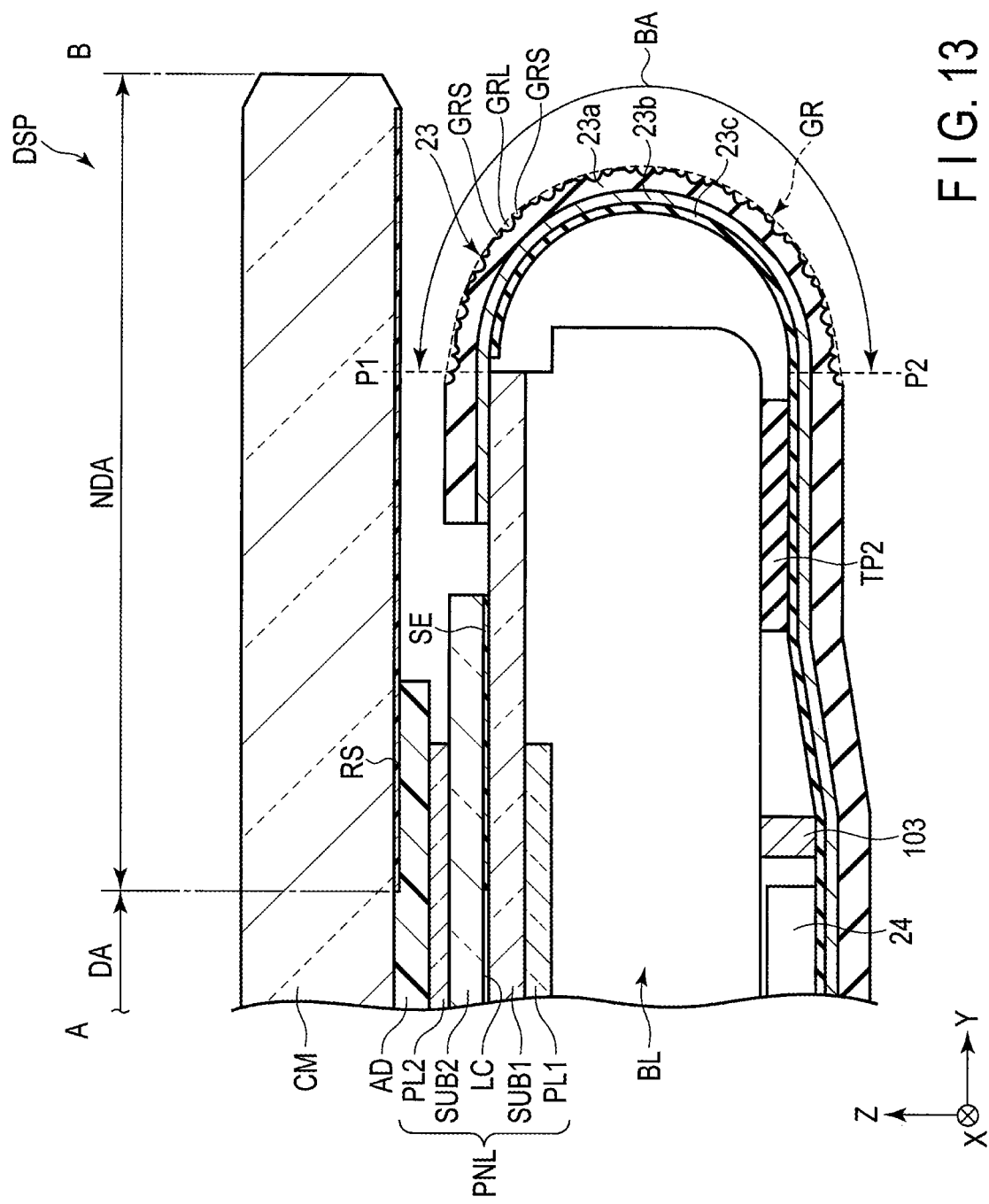
FIG. 13 is a cross-section of the display device of the second embodiment, taken along line A-B shown in FIG. 2.

FIG. 13 is a cross-section of a display device DSP taken along line A-B shown in FIG. 2. FIG. 14 is a diagram showing the wiring substrate 23 shown in FIG. 1. FIG. 14, part (a) shows a plan view of the wiring substrate 23 when developed, and FIG. 14, part (b) shows a cross section of the wiring substrate 23 along the second direction Y when developed. The structure shown in FIGS. 13 and 14 is different from the structure shown in FIGS. 3 and 4 in the shape of the groove portions GR.

As shown in FIG. 13, the groove portions GR overlap the bending start point P1 and the bending end point P2. As shown in FIG. 14, part (a), the groove portions GR include a groove portion GR11 extending along a downward sloping direction, and a groove portion GR12 extending along an upward sloping direction. The groove portions GR11 and GR12 cross each other. As shown in FIG. 14, part (b), in the portions of the groove portions GR11 and GR12, where they do not cross each other, a small groove portion GRS is formed, whereas in the portions where the groove portions GR11 and GR12 cross each other, a large groove portion GRL is formed. The large groove portion GRL is formed more deeply than the small groove portion GRS.

In the third embodiment as well, an advantageous effect similar to that of the first embodiment can be obtained.

Next, the fourth embodiment will now be described with reference to FIGS. 15 and 16.

FIG. 15 is a cross-section of a display device DSP taken along line A-B shown in FIG. 2. FIG. 16 is a diagram showing the wiring substrate 23 shown in FIG. 15. FIG. 16, part (a) shows a plan view of the wiring substrate 23 when developed, and FIG. 16, part (b) shows a cross section of the wiring substrate 23 along the second direction Y when developed. The structure shown in FIGS. 15 and 16 is different from the structure shown in FIGS. 3 and 4 in the shape of the groove portions GR.

As shown in FIG. 15, the groove portions GR overlap the bending start point P1 and the bending end point P2. The groove portions GR consist of a plurality of dotted groove portions GRD. The groove portions GRD are each formed in a circular shape in plan view.

In the fourth embodiment as well, an advantageous effect similar to that of the first embodiment can be obtained.

Subsequently, a method of forming the groove portions GR of the wiring substrate 23 will be described.

The groove portions GR described above can be formed by irradiating UV laser onto the surface of the base member 23a in the atmosphere, thus partially removing the base member 23a, followed by linearly processing. For example, substantially flat groove portions GR are formed by finely irradiating laser of a dot pattern having a diameter of 25 μm. By adjusting parameters such as the output of laser, scanning speed, frequency and the number of times of printing, the groove portions GR can be formed with arbitrary processing depth, size and pattern. Moreover, the diameter of laser is not limited to 25 μm, but can be increased or decreased to form the groove portions GR with arbitrary processing depth, size and pattern. Furthermore, by introducing an alignment mechanism, arbitrary parts can be processed with high precision. Thus, the fracture of the wiring substrate 23, the breaking of the wiring lines 23b and the like, which may occur while processing the groove portions GR, can be suppressed. Moreover, the processing can be carried out at a minimum number of steps. For example, as the wavelength of laser, THG, SHG or 1064 nm can be used. Moreover, the kind of laser can be selected according to the characteristics of the object irradiated.

Figure 17:
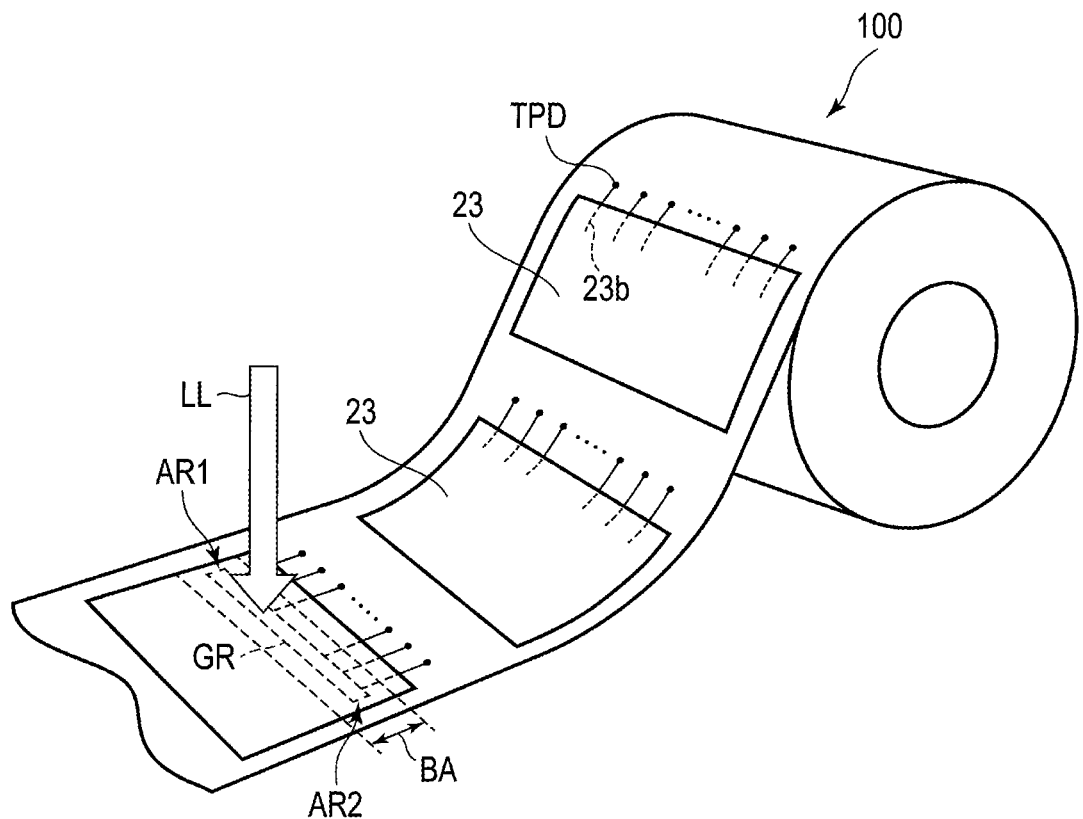
FIG. 17 is a diagram showing a processing step of forming groove portions in the first wiring substrate in the first embodiment.

FIG. 17 is a diagram showing the first embodiment of the process of forming the groove portions GR in the wiring substrate 23.

A mother board 100, from which wiring substrates 23 are formed, is wound around a reel. A plurality of wiring substrates 23 are formed from one mother board 100 by cutting out with a trimming die. The mother board 100 comprises base members 23a, wiring lines 23b, and protective layers 23c, shown in FIG. 3. Test pads TPD, which test the electrical connection of the wiring substrates 23 are disposed on outer sides of the wiring substrates 23, respectively. A plurality of wiring lines 23b are led out to the outside of each of the wiring substrate 23 and are connected to the respective inspection pad TPD.

In the example shown in FIG. 17, before the wiring substrates 23 are cut out from the mother board 100, laser LL is irradiated onto the wiring substrates 23, thereby forming the groove portions GR. The groove portions GR are formed between the first frame region AR1 and the second frame region AR2 in the bend area BA.

Figure 18:
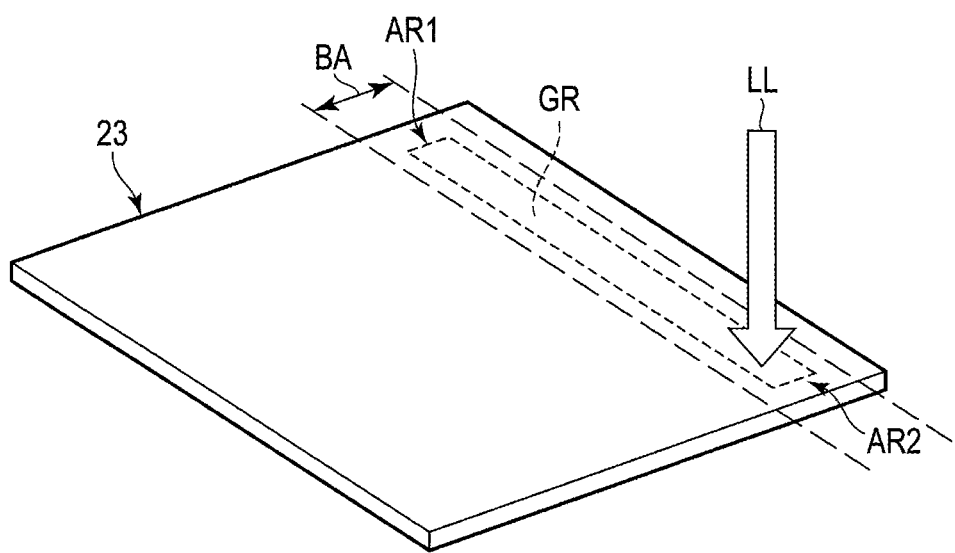
FIG. 18 is a diagram showing a processing step of forming groove portions in the first wiring substrate in the second embodiment.

FIG. 18 is a diagram showing the second embodiment of the process of forming the groove portions GR in the wiring substrate 23.

In the example shown in FIG. 18, laser LL is irradiated onto a single body of the wiring substrate 23 to form the groove portions GR. That is, after cutting out the wiring substrate 23 from the mother board 100 as shown in FIG. 17, or just before mounting the wiring substrate 23 to the display panel PNL, the groove portions GR are formed. The groove portions GR are formed between the first frame region AR1 and the second frame region AR2 in the bend area BA.

FIG. 19 is a diagram showing the third embodiment of the process of forming the groove portions GR in the wiring substrate 23.

In the example shown in FIG. 19, after mounting the wiring substrate 23 in the display panel PNL, laser LL is irradiated onto the base member 23a to form the groove portions GR. The groove portions GR are formed between the first frame region AR1 and the second frame region AR2 in the bend area BA. After forming the groove portions GR, the bend area BA of the wiring substrate 23 is bent.

FIG. 20 is a diagram showing the fourth embodiment of the process of forming the groove portions GR in the wiring substrate 23.

In the example shown in FIG. 20, after the wiring substrate 23 is bent, the groove portions GR are formed in the wiring substrate 23 with laser LL. Or, at the end of the process of manufacturing the display device DSP, the groove portions GR are formed in the wiring substrate 23 with laser LL. The groove portions GR are formed between the first frame region AR1 and the second frame region AR2 in the bend area BA.

The process of forming the groove portions GR with the laser LL may be carried out by the single body of the laser mechanism, or in a mounting machine which mounts the wiring substrate 23 in the display panel PNL. Moreover, it is also possible to install a laser mechanism in an arbitrary location in the device which manufactures the display device DSP. The process shown in FIGS. 17 to 20 is applicable to all of the patterns of the groove portions GR described above. In particular, of the embodiments described above, the pattern of the groove portions GR of the first embodiment shown in FIGS. 1 to 8 has a small laser irradiated area, and therefore the laser irradiation time is short, thus making it possible to shorten the processing time.

As described above, according to the embodiments, the display device with improved reliability, a flexible printed circuit, and a method of manufacturing such a display device can be obtained.

Note that in the examples, the drive IC chip 24 is mounted on the wiring substrate 23, but the drive IC chip 24 may be mounted on the display panel PNL. Moreover, as long as the wiring substrate 23 has a sufficient strength, the groove portions GR may be formed in the first frame region AR1 and the second frame region AR2 as well. Further, the pattern of the groove portions GR can be adjusted into arbitrary shape, and patterns other than the above may be used. Furthermore, this specification discusses the display devices DSP as examples, but the embodiments can be adapted for electronic devices which employ the flexible printed circuits 23. In that case, for example, the wiring substrate 23 is mounted in the pad portions arranged on the glass substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
   a glass substrate;
   a plurality of pad portions arranged along a first direction on the glass substrate; and
   a flexible printed circuit mounted on the plurality of pad portions, wherein
   the flexible printed circuit comprises a base member comprising a first surface and a second surface on an opposite side to the first surface, wiring lines located on the first surface, and a protective layer which covers the wiring lines,
   the base member comprises a first edge, a second edge, and a groove portion formed on the second surface,
   the groove portion is located between the first edge and the second edge along the first direction,
   the both ends of the groove portion along the first direction are located on inner sides with respect to the first edge and the second edge, respectively,
   the groove portion is not penetrating the base member,
   a first of both ends of the groove portion is located on a side of the first edge and a second end is located on a side of the second edge,
   a thickness of the base member between the first edge and the first end is greater than a thickness of the base member in the groove portion, and
   a thickness of the base member between the second edge and the second end is greater than a thickness of the base member in the groove portion, wherein a distance between the first edge and the first end along the first direction and a distance between the second edge and the second end along the first direction are each 0.2 mm or greater but 0.5 mm or less.

2. The electronic device of claim 1, wherein the groove portion overlaps the wiring lines.

3. The electronic device of claim 1, wherein the groove portion extends along the first direction and crosses the wiring lines.

4. The electronic device of claim 1, wherein at least a part of the groove portion overlaps the glass substrate.

5. The electronic device of claim 1, further comprising:
   a drive IC chip mounted on the first surface side of the base member, wherein
   the groove portion is located between the plurality of pad portions and the drive IC chip.

6. The electronic device of claim 5, wherein the groove portion extends along the first direction and crosses the wiring lines, and at least a part of the groove portion overlaps the glass substrate.

7. The electronic device of claim 5, wherein the flexible printed circuit comprises a bending start point extending along the first direction, and the groove portion overlaps the bending start point.

8. The electronic device of claim 5, wherein the flexible printed circuit comprises a bending end point extending along the first direction, and the groove portion overlaps the bending end point.

9. The electronic device of claim 5, wherein the groove portion comprises a first groove portion and a second groove portion, the first groove portion extends along the first direction, the second groove portion extends parallel to the first groove portion, the first groove portion is located closer to the plurality of pad portions than the second groove portion, and the second groove portion is located closer to the drive IC chip than the first groove portion.

10. The electronic device of claim 9, wherein the flexible printed circuit comprises a bending start point extending along the first direction, and the first groove portion overlaps the bending start point.

11. The electronic device of claim 9, wherein the flexible printed circuit comprises a bending end point extending along the first direction, and the second groove portion overlaps the bending end point.

12. A flexible printed circuit comprising:
   a base member comprising a first surface and a second surface on an opposite side to the first surface;
   wiring lines located on the first surface; and a protective layer which covers the wiring lines, wherein the wiring lines are arrayed in a first direction, the base member comprises a first edge, a second edge, and a groove portion formed on the second surfce, the groove portion is located between the first edge and the second edge along the first direction, the both ends of the groove portion along the first direction are located on inner sides with respect to the first edge and the second edge respectively, the groove portion is not penetrating the base member, a first of both ends of the groove portion is located on a side of the first edge and a second end is located on a side of the second edge, a thickness of the base member between the first edge and the first end is greater than a thickness of the base member in the groove portion, and a thickness of the base member between the second edge and the second end is greater thatn a thickness of the base member in the grove portion, wherein a distance between the first edge and the first end along the first direction and a distance between the second edge and the second end along the first direction are each 0.2 mm or greater but 0.5 mm or less.

13. A flexible printed circuit of claim 12, wherein the groove portion extends along the first direction and crosses the wiring lines.

14. The flexible printed circuit of claim 12, further comprising: a drive IC chip mounted on the first surface side of the base member, wherein the groove portion does not overlap with the drive IC chip.

15. The flexible printd circuit of claim 14, wherein the flexible printed circuit comprises a bending start point extending along the first direction, and
the groove portion overlaps the bending start point.

16. The flexible printed circuit of claim 14, wherein the flexible printed circuit comprises a bending end point extending along the first direction, and
the groove portion overlaps the bending end point.

17. The flexible printed circuit of claim 14, wherein the groove portion comprises a first groove portion and a second groove portion, the first groove portion extends along the first direction,
the second groove portion extends parallel to the first groove portion, and
the second groove portion is located between the first groove portion and the drive IC chip.

18. The flexible printed circuit of claim 17, wherein
the flexible printed circuit comprises a bending start point and a bending end point,
the bending start point extends along the first direction,
the bending end point extends along the first direction,
the first groove portion overlaps the bending start point, and
the second groove portion overlaps the bending end point.

* * * * *